(12) United States Patent
Thurmaier

(10) Patent No.: US 9,671,458 B2
(45) Date of Patent: Jun. 6, 2017

(54) SYSTEM AND GUIDED APPROACH DEVICE FOR GUIDING A HANDLER OR A TESTER TOGETHER WITH A DEVICE INCLUDING A TEST HEAD FOR ELECTRONIC COMPONENTS

(71) Applicant: TURBODYNAMICS GMBH, Riedering (DE)

(72) Inventor: Stefan Thurmaier, Au/Bad Feilnbach (DE)

(73) Assignee: Turbodynamics GmbH, Riedering (DE)

( * ) Notice: Subject to any disclaimer, the term of this patent is extended or adjusted under 35 U.S.C. 154(b) by 78 days.

(21) Appl. No.: 14/650,760

(22) PCT Filed: Dec. 13, 2013

(86) PCT No.: PCT/EP2013/076623
§ 371 (c)(1),
(2) Date: Jul. 29, 2015

(87) PCT Pub. No.: WO2014/091022
PCT Pub. Date: Jun. 19, 2014

(65) Prior Publication Data
US 2015/0331042 A1    Nov. 19, 2015

(30) Foreign Application Priority Data

Dec. 14, 2012 (DE) .......................... 10 2012 112 271

(51) Int. Cl.
*G01R 31/00* (2006.01)
*G01R 31/28* (2006.01)
*G01R 31/26* (2014.01)

(52) U.S. Cl.
CPC ..... *G01R 31/2887* (2013.01); *G01R 31/2601* (2013.01)

(58) Field of Classification Search
CPC ............ G01R 31/2887; G01R 31/2893; G01R 31/2889; G01R 31/2851; G01R 31/2891;
(Continued)

(56) References Cited

U.S. PATENT DOCUMENTS

| 4,588,150 A | 5/1986 | Bock et al. |
| 5,654,631 A * | 8/1997 | Ames ................. G01R 31/2887 324/754.16 |

(Continued)

FOREIGN PATENT DOCUMENTS

| DE | 10216003 A1 | 11/2003 |
| DE | 102004031426 A1 | 1/2006 |

(Continued)

*Primary Examiner* — Vinh Nguyen
(74) *Attorney, Agent, or Firm* — Rankin, Hill & CLark LLP

(57) ABSTRACT

A guided approach device for guiding together a first device (handler or tester) and a second device (including a test head for electronic components), including a latching device with a cylindrical pin socket for holding and fixing a front end of a catch pin. The latching device is connected to a linear displacement device such that the cylindrical pin socket may be displaced in a linear direction at least a short distance corresponding to a multiple of a length of a leading section of the catch pin, which may be inserted into the pin socket. Additionally or alternatively, the latching device is connected to a linear displacement device such that the latching element, a spring element and the pin socket may be displaced, with the catch pin engaged, in a linear direction by the linear displacement device, so that the first and second devices maybe moved relative to one another.

28 Claims, 10 Drawing Sheets

Figure 1A:
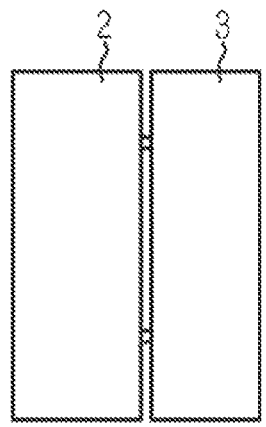

(58) Field of Classification Search
CPC .......... G01R 31/2808; G01R 31/31905; G01R 1/0408; G01R 31/26; G01R 1/04; G01R 1/07378; G01R 31/2834; G01R 31/31926; G06F 1/1632; G06F 1/166; G06F 13/409; G06F 15/7867; G01M 3/2815; G01M 99/005; G01N 1/312; G01N 2035/00039; G06K 13/0825
See application file for complete search history.

(56) References Cited

U.S. PATENT DOCUMENTS

| | | | |
|---|---|---|---|
| 6,551,122 B2 * | 4/2003 | Bosy | G01R 31/31721 439/348 |
| 6,831,296 B1 * | 12/2004 | Lee | G01R 31/2886 257/48 |
| 7,382,145 B2 * | 6/2008 | Thurmaier | G01R 31/2887 269/309 |
| 2003/0194821 A1 | 10/2003 | Chiu et al. | |
| 2003/0218869 A1 | 11/2003 | Thurmaier | |
| 2004/0018048 A1 | 1/2004 | Sausen | |
| 2009/0261842 A1 | 10/2009 | Widhammer et al. | |

FOREIGN PATENT DOCUMENTS

| | | |
|---|---|---|
| EP | 1495339 B1 | 10/2007 |
| JP | H0288400 A | 3/1990 |
| JP | H09159730 A | 6/1997 |

* cited by examiner

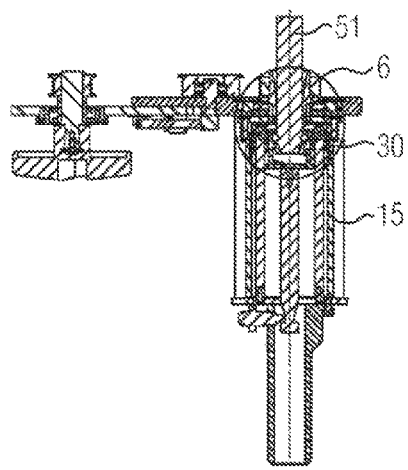 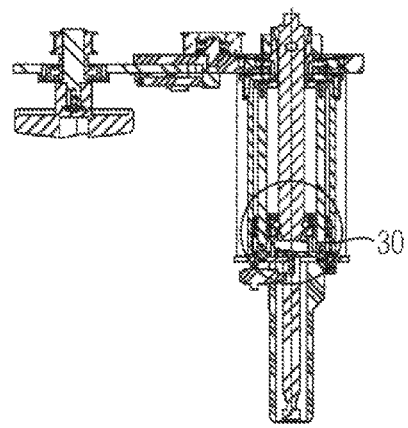
FIG. 9a  FIG. 9b
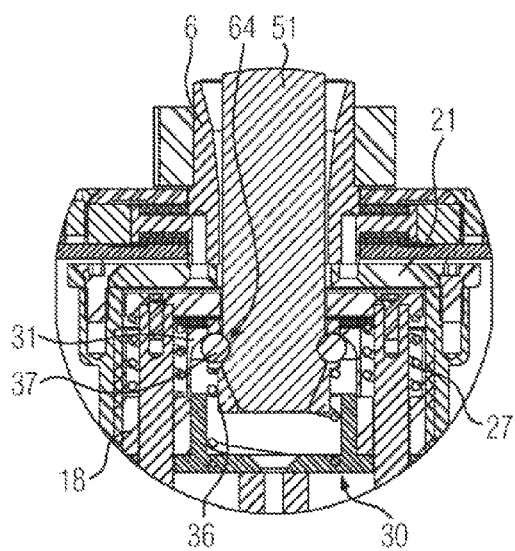 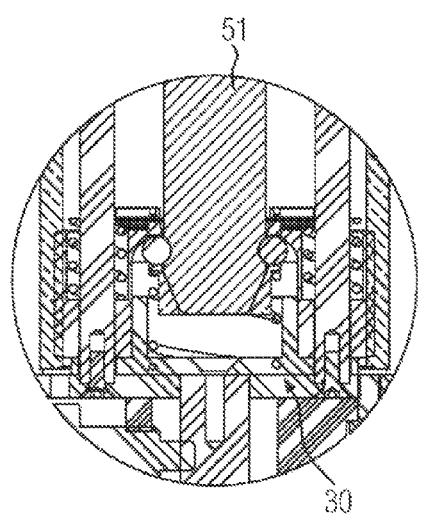
FIG. 10a  FIG. 10b

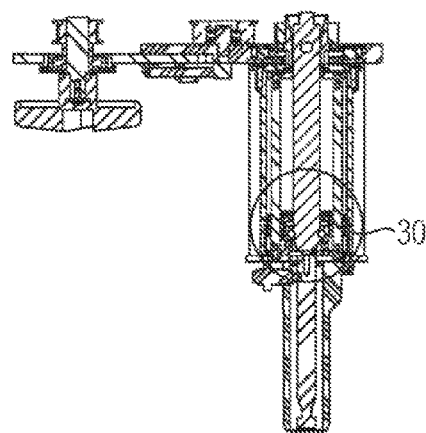
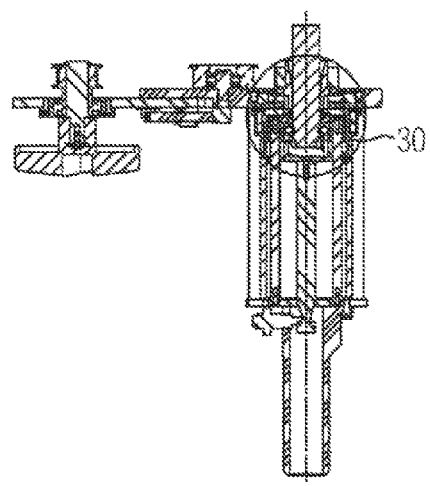
FIG. 9c  FIG. 9d
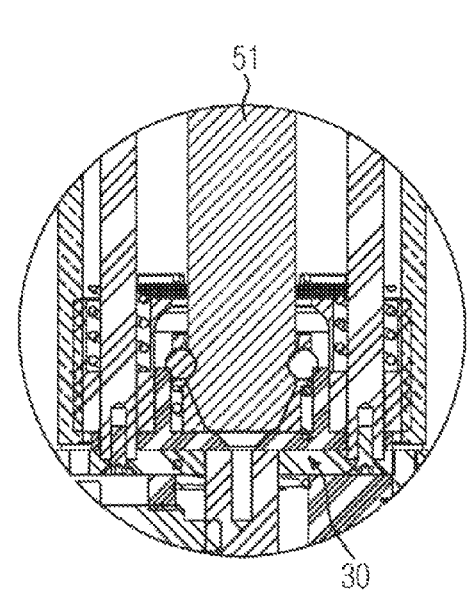
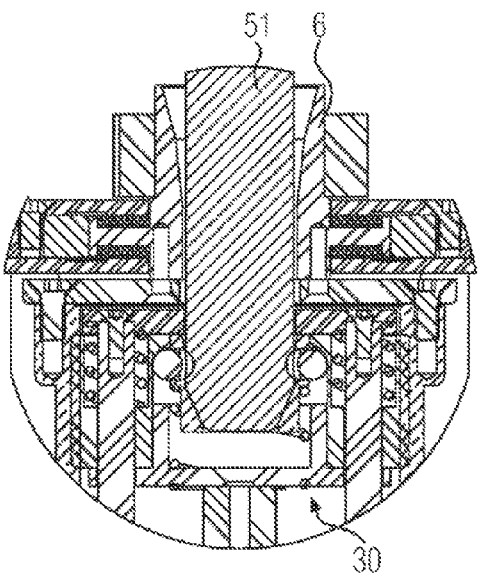
FIG. 10c  FIG. 10d

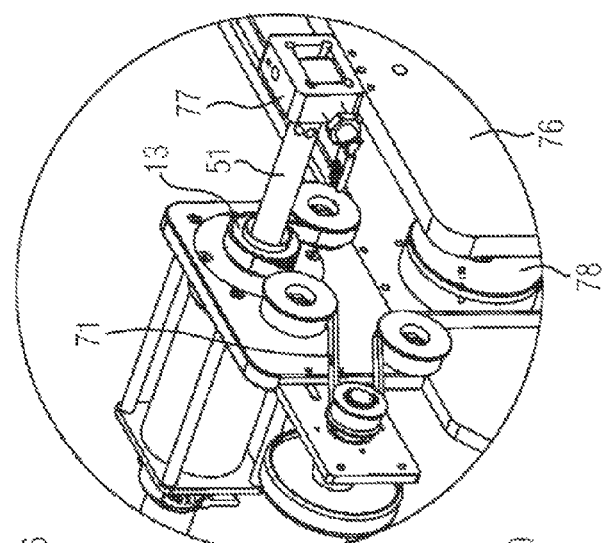
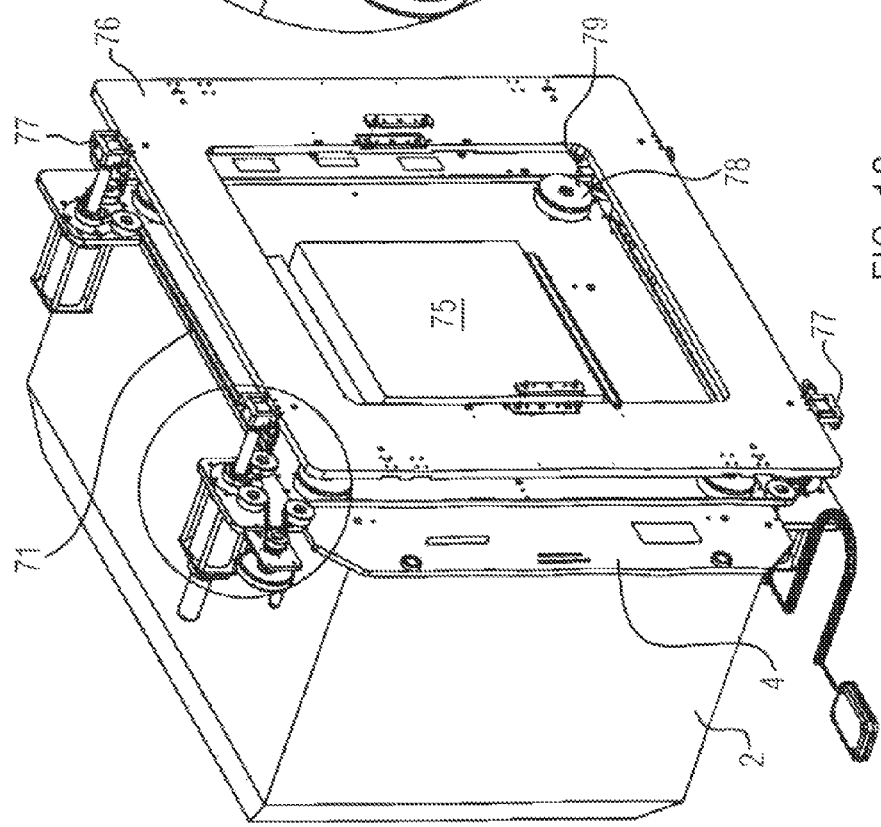
FIG. 13b
FIG. 13a

SYSTEM AND GUIDED APPROACH DEVICE FOR GUIDING A HANDLER OR A TESTER TOGETHER WITH A DEVICE INCLUDING A TEST HEAD FOR ELECTRONIC COMPONENTS

The present invention relates to a guided approach device for the guiding together of a first device comprising a handler or a tester and a second device comprising a test head for electronic components.

Described in DE 10 2004 031 426 A1 are a docking drive, a locking element and a docking system. The docking system is designed to connect a test head with a handler, a tester or a reinforcing frame. This docking system has four locking mechanisms, designed according to the plug-socket principle. Also provided are locking drives which may have stepping motors. The locking mechanism has a bushing, into which a pin (locking element) may be inserted. To lock the pin in the bushing, spring-loaded locking elements (capture devices and locking devices) are provided, to engage in corresponding locations in the pin. For shifting the bushing, a worm gear drawing-in mechanism (movement mechanism) is provided. A worm shaft of the drawing-in mechanism is in engagement with a threaded bore in a bottom plate (beam) of the bushing. The spring-loaded locking elements are accommodated in an annular bushing wall (component) connected to the bottom plate of the bushing. The bushing may be shifted in the docking direction or Z-direction by the worm drive. Through the use of a worm drive, the worm extends into the interior of the bushing during drawing-in of the bushing and the pin, and must therefore be accommodated in the pin. Consequently the pin has an elongated location (opening), open in the Z-direction, to accommodate the worm shaft of the drawing-in mechanism.

US 2004/0 018 048 A1 discloses a pneumatic docking system. This docking system discloses catch pins which have a conical end section which may be fitted into a corresponding recess of a locating element. The fixing of the conical end section of the catch pin is effected by means of three latching elements with corresponding conical seats.

Described in US 2003/0 194 821 A1 is an automatic test system. This test system has an under-structure which is intended for use when exchanging an interface unit. The under-structure has a folding element which is attached to a test system. In addition, a telescopic element is mounted slidably on the folding element. To fix the interface unit on to the telescopic element, several pins may be provided; these engage in corresponding recesses in the interface unit.

A further docking device is disclosed in DE 102 16 003 B4. This docking device includes a locking unit which has a threaded sleeve with inside thread which may be set to rotate by an actuating device. A ball clamping sleeve is here non-rotatable but may be displaced in its axial direction and has an outside thread which engages with the inside thread of the threaded sleeve, so that rotation of the threaded sleeve is coupled with an axial movement of the ball clamping sleeve. The threaded sleeve works here as a kind of axially fixed spindle nut, while the non-rotatable ball clamping sleeve is comparable to a spindle which is moved axially through the rotation of the threaded sleeve.

The docking of the test head at the handling device is here effected in such a way that firstly the test head is moved on to the handling device or docking plate until locking pins are inserted in central insertion openings of the locking units, by which means the test head is centered. Then the locking units are actuated by rotation of the handling part in such a way that the locking pins and with them the test head are drawn a small distance further towards the docking plate as far as the end position, where locking in this position takes place.

This docking device facilitates provision of a precisely aligned connection between the test head and a handling device. In addition, the docking device may be so designed that the locking unit(s) may be fastened without further ado at various points on the docking plate so that, if there is a change in type of test head or handling device, it is often necessary only to attach the locking units to other points on the docking plate so as to match a different test head or a different handling device. The docking device is therefore also more easily adaptable to other types of device.

With this docking device, bringing together the test head weighing up to 1000 kg and the handling device requires at least two persons, in order to align the test head and the handling device in such a way that the locking pins may be inserted in the corresponding locking units, since the test head on account of its dead weight is very inert and therefore it is not always possible to align the locking pins in optimal linear alignment with the locking units. In this connection it should also be noted that the centre of gravity may vary considerably depending on the state of alignment of the test head, and it is not always possible to align the point of application on the test head optimally with regard to its centre of gravity.

DE 10 021 600 03 B4 discloses a docking device for connecting a semiconductor test head with a semiconductor handler on an exactly aligned position. This has one test-head-side and one handler-side connecting device, a handling device for handling a contacting device, and a coupling device for coupling the connecting devices. The coupling device has a first displacing device which allows the translatory and guided displacement of the test-head-side connecting device relative to the handler-side connecting device, towards and away from one another.

For testing electronic components, such as for example integrated circuits (IC), a testing device with a test head is used, which must be connected to a handling device for the electronic components, for example a handler or tester. In order to facilitate docking of the test head, weighing up to 1000 kg, with the handling device in the most simple, easy and precise manner, special docking devices, i.e. coupling devices, have been developed, these are fastened on one side to the handling device and at the other side to the test head.

Despite the use of such a docking device, the guiding together of a test head and a handling device is laborious. The test head is lifted by a manipulator and manoeuvred in the lifted state to the handling device. This generally requires two persons, who position the test head precisely relative to the handling device, so that the docking device can connect the two devices.

DE 10 2012 103 893, not yet published, relates to a drawer-like module for interchanging a roughly flat interface unit in a test system for the testing of semiconductor elements. The module includes a base element, a holder and guide elements. The guide elements are so designed that the interface unit may be traversed, by means of a straight-line translatory movement, from an end position into an intermediate position, and from the intermediate position into a removal position which is located outside the test system. The mechanism includes a lever mechanism controlled by a slotted link mounted transversely to the straight-line translatory movement of the holder.

The problem of the present invention is to provide a device which facilitates a simple guiding together of test head and handling device.

The invention has for the solution of this problem the features hereinafter disclosed and/or claimed.

A guided approach device according to a first aspect of the present invention is designed for the guiding together of a first device consisting of a handler or a tester and a second device comprising a test head for electronic components, wherein the docking device may be attached to the first or the second device. Also provided is a latching device with a cylindrical pin socket for receiving and latching engagement of a front end of a catch pin, wherein the catch pin may be attached accordingly to the other device, and the latching device is so connected to a linear displacement device that the cylindrical pin socket may be shifted by the linear displacement device at least a short linear distance corresponding to a multiple of the length of the leading section of the catch pin which may be inserted in the pin socket.

In the context of the present invention, a handling device is understood to mean a handler or a tester.

The term "guided approach" means that the first and second device are displaced over a predetermined distance, preferably amounting to at least 10 cm, in particular 15 cm or 20 cm.

The leading section of the catch pin which may be inserted in the pin socket extends from the front end of the catch pin as far as the latching means of the latching device, which engage with the catch pin.

During connection of the test head to the handling device, the test head is generally held by a manipulator, for guiding to and positioning on the handling device.

To date, the test head and the handling device have been guided together manually by the operator of the test unit. Only when the test head is positioned directly adjacent to the handling device, i.e. at a distance of less than 5 cm, have the two devices been joined together and exactly aligned by means of a docking device.

The exact positioning of the test head relative to the handling device was very laborious and generally required two operators. Here it should be taken into account that docking devices are designed for precise alignment of handling device and test head relative to one another. Therefore locking pins of such a docking device are held virtually without play in corresponding recesses of a locking unit. This means, however, that the test head and the handling device, also the locking pins and the corresponding recesses, must be positioned precisely relative to one another, both in terms of their position and also their linear alignment or direction. The end faces of the test head and the handling device should be positioned with minimal clearance from one another, and aligned parallel to each other, so that all locking pins are able to engage in the corresponding recesses. All of this makes the connection of test head and handling device a laborious process.

With the guided approach device according to the invention, the handling device and the test head may be guided together by a predetermined distance, since the cylindrical pin socket may be shifted in a straight line by the linear displacement device by at least a displacement distance corresponding to a multiple of the length of the section of the catch pin which may be inserted in the pin socket.

The displacement distance amounts preferably to at least 4, 5 and in particular 10 times the length of the section of the catch pin which may be inserted in the pin socket.

The guiding together of the handling device and the test head is considerably simplified.

A further advantage of the guided approach device according to the invention lies in the fact that, for maintenance work, the handling device and the test head may be moved a short distance apart, so that their end faces lie free, without the need to release the latching engagement between the catch pin and the pin socket. After the maintenance work is finished, the handling device and the test head may be simply guided together again by means of the linear displacement device. On the other hand, a complete release of the test head from the handling device is also easily possible, by releasing the latching connection between the catch pin and the latching connection. The guided approach device according to the invention thus makes handling of the handling device and the test head during maintenance work considerably more easy.

The linear displacement device may include a movement device which, offset to the side of a locating area formed in the pin socket, acts to accommodate a catch pin, wherein preferably a linear guide may be provided.

Due to the fact that the movement device acts offset to the side of a locating area formed in the pin socket, the linear path by which the pin socket may be displaced by means of the linear displacement device can be of any desired length. This is because the path over which the pin socket may be displaced is not obstructed by the arrangement of the mechanical structure of the movement device of the linear displacement device. This means that the movement device is offset next to or to the side of the pin socket or to a pin space, and not in the area into which the pin socket is displaced.

The guided approach device may also have in the area of the cylindrical pin socket a catch pin to hold and locate by latching the front end of a catch pin and/or, in the area of an insertion opening or insertion bushing, a certain degree of play relative to the catch pin. This also simplifies the guiding together of test head and handling device, since the catch pin and the latching device need not be aligned so exactly with one another in the linear direction.

Preferably at least one guided approach device or several guided approach devices are fastened to one connection plate, which in turn is connected either to the handling device or to the test head.

The connection plate is frame-like in design, with a central recess, into which an interface unit or a contacting device is fitted. The interface unit is also described as the LOAD board. This interface unit is also described amongst experts as a DUT board (DUT=Device Under Test), PC (Probe Card), HIB (Handler Interface Board) or PIB (Prober Interface Board).

The interface unit may be mounted on a drawer module, as disclosed in JP09159730A, EP1495339B1 or US 2003/0194821A1 and DE 10 2012 103 893. Such a drawer module includes a mechanism for the guided moving in and out of an interface unit from the area between the test head and the handling device. In exchanging the interface unit, this is drawn out from the area between the handling device and the test head, so that the interface unit may be replaced.

To pull out the drawer module it was formerly necessary to release the connection between the handling device and the test head, which is accompanied by the problems of guiding together described above, or else it was provided in a scissors mechanism which is firmly connected to the test head and the handling device and cannot easily be released from these devices. With the guided approach device according to the invention, the handling device and the test head may be drawn apart by a predetermined length, in order to replace the interface unit. At the same time the front end of the catch pin remains firmly engaged in the latching device of the cylindrical pin socket. Consequently, after replacing the interface unit, the handling device and the test head may easily be guided together.

According to a second aspect of the present invention, the guided approach device is formed by a first device comprised of a handler or a tester and a second device comprising a test head for electronic components, wherein the guided approach device may be attached to the first or the second device. The guided approach device has a latching device which includes at least one latching element, a spring element for applying a spring force to the latching element, and a pin socket. A catch pin may be correspondingly attached to the other device, wherein the catch pin may be fixed in the pin socket by means of the latching element, and the latching device is so coupled to a linear displacement device that the latching element, the spring element and the pin socket of the latching device with catch pin engaged may be shifted in a linear direction by means of the linear displacement device.

The latching device may be shifted in a straight line by mean of the linear displacement device, wherein the displacement path in itself is of any desired length, and limited only by the space factors at the test head or the handling device.

The guided approach device according to the second aspect of the invention allows a displacement path of any desired length, so that all the advantages described above with the aid of the first aspect are obtained to an equal extent.

According to a third aspect of the present invention, the guided approach device is formed by a first device comprised of a handler or a tester and a second device comprising a test head for electronic components, wherein the device may be attached to the first or the second device. The device has a latching device with a cylindrical pin socket for receiving and latching fixing of a front end of a catch pin, wherein an insertion bushing is provided which has at least one conical insertion section allowing insertion of the catch pin under a predetermined angle.

Because the insertion bushing has at least one conical insertion section, it is possible to insert the catch pin under a predetermined angle of 0° to 40° and in particular 0° to 40° relative to a longitudinal axis.

The longitudinal axis is concentric to the cylindrical pin socket and extends along the displacement path of the cylindrical pin socket.

It is also possible according to the invention to provide a securing device, which safely and reliably prevents unintended release of the catch pin from the latching device.

The securing device for the guided approach device, which is also suitable for the docking device, represents a free-standing inventive concept and may also be used in a conventional docking device.

The securing device may be so designed as to provide on the cylindrical pin socket, on the side facing away from the catch pin, a locking pin extending in the axial direction, which may be locked in such a way that the latching device is limited in its axial movement. Because of this, latching elements—such as balls—of the latching device are fixed in their latching position, while only by releasing the locking effect of the locking pin may the latching elements be brought into external engagement with the catch pin.

The securing device may also have a spring element such as e.g. a disc spring or a coil spring, wherein this must first be pressed together with a predetermined force in order to bring the latching elements out of engagement with the catch pin.

The guided approach device may also be so designed that the catch pin, in the retracted state, abuts a stop, so that the device is designed not only for guiding together but also for aligning and positioning of handling device and test head relative to one another. Preferably the stop is conical and fits positively in a conical or funnel-shaped section of an insertion opening.

According to such a development of the guided approach device, the catch pin may be held and locked in the pin socket of the latching device almost without play.

A system according to the invention for the guiding together of a first locking consisting of a handler or a tester and a second device comprising a test head for electronic components includes preferably a handling device, a test head attached to a traversable manipulator, and at least one guided approach device according to the invention, together with a corresponding catch pin. The entire operation of guiding together and releasing test head and handling device may be carried out by a single person. The manipulator takes the weight of the test head and, since at least one catch pin is provided, the test head must be only roughly positioned, after which it is pulled in by the latching device of the guided approach device and "positioned exactly".

In addition, at least one docking device may be provided, e.g. of similar design to the docking device described in DE 102 16 003 B4, in order to align the handling device and the test head precisely with one another and to join them together. Reference is hereby made to the full contents of DE 102 16 003 B4.

Such a system may also include a drawer element as described above.

Figure 1B:
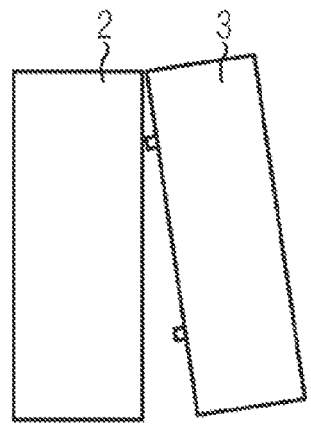

It is often not easy to arrange the test head, owing to its high dead weight, so precisely in its position relative to the handling device that the handling device and the test head may be connected by a conventional swivel ring device. If the test head is tilted below a predetermined angle relative to the handling device, then a locking pin cannot be inserted in a corresponding bushing of the docking device (FIG. 1a, FIG. 1b). In this case, manual assistance is necessary for the handling device and the test head to be aligned and guided together. Even with slight angles of inclination of the test head relative to the handling device, it is no longer possible to insert a locking pin in the locking unit, since for example an edge of the test head contacts the handling device without a locking pin entering a recess of a locking unit. Therefore as already explained above, at least two persons are needed to align the test head relative to the handling device in such a way that the locking pins may be inserted in the corresponding recesses of the locking units. Moreover, generally all locking pins must enter the corresponding recesses of the locking units synchronously or simultaneously.

Figure 2A:
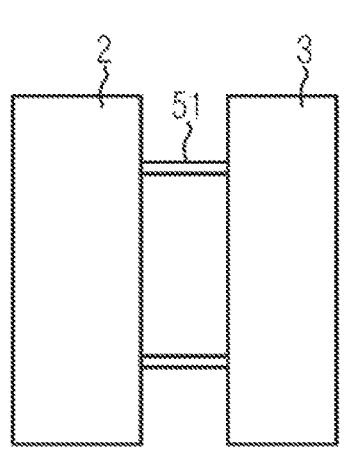
Figure 2B:
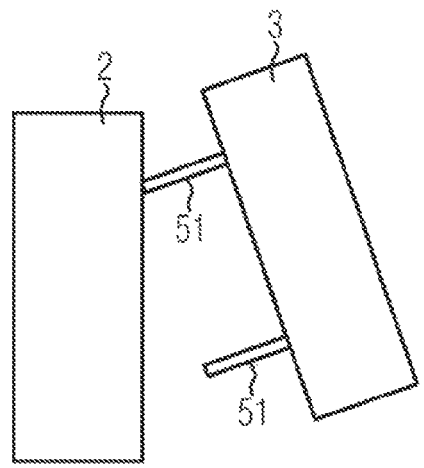
Figure 3:
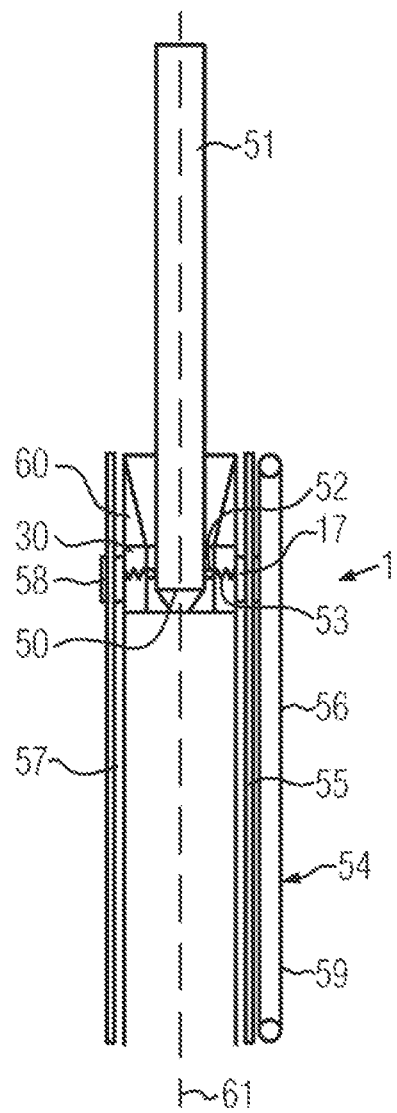
Figure 4:
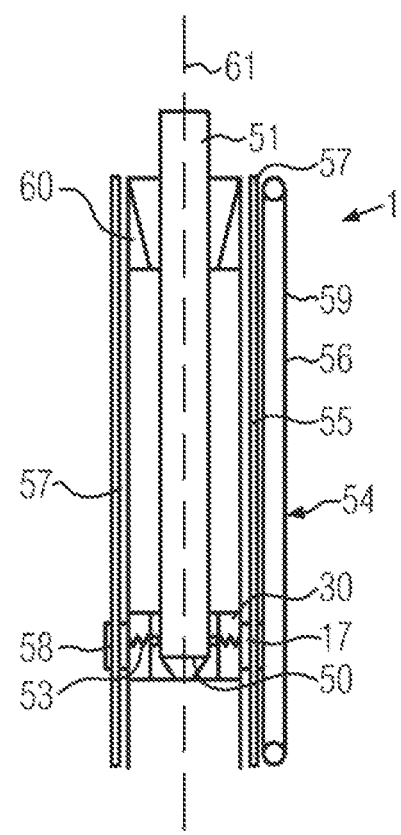
Figure 5:
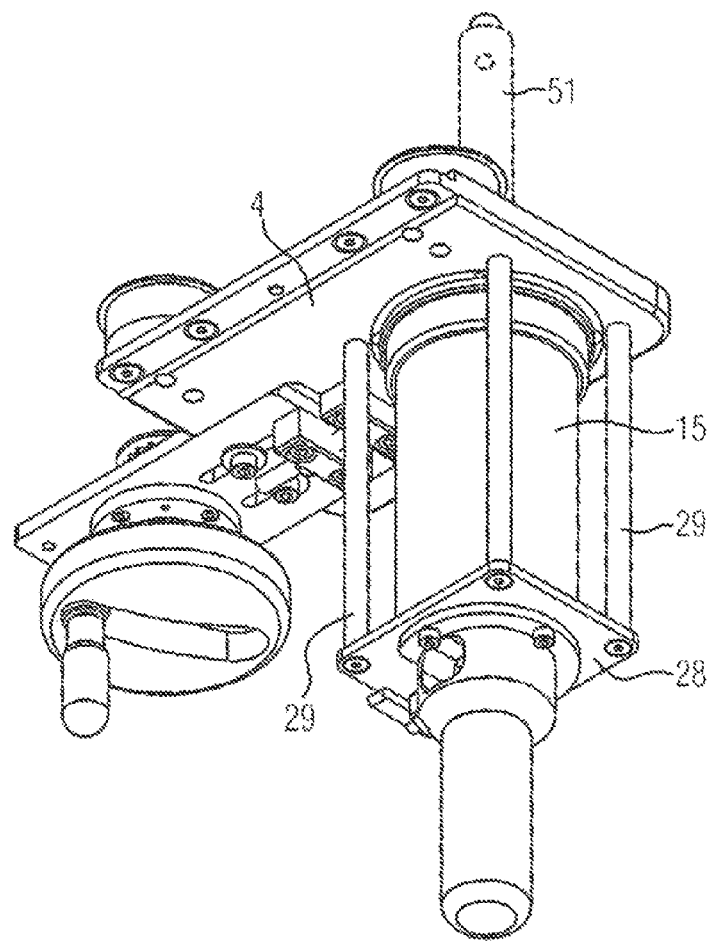
Figure 7:
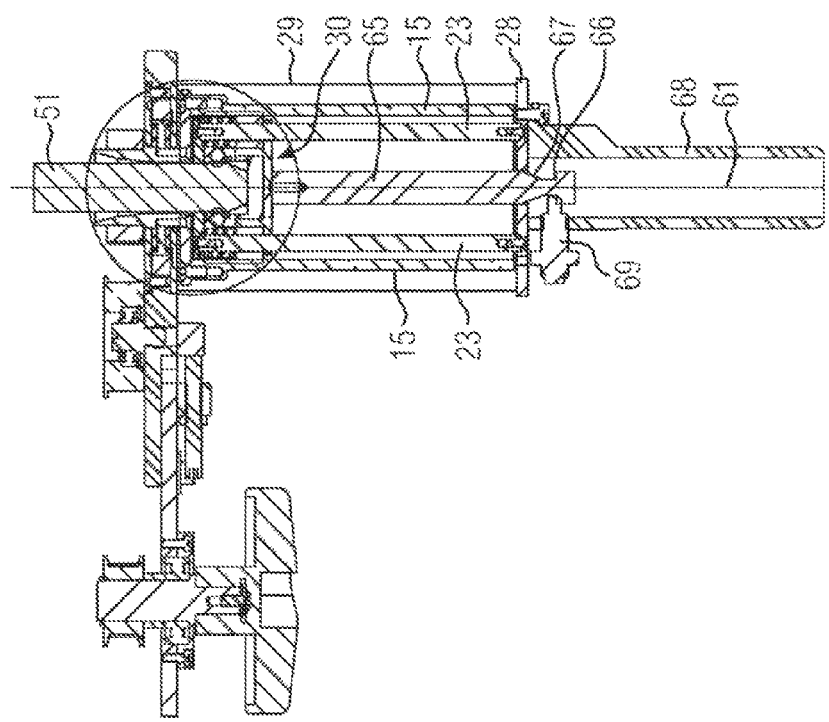
Figure 6:
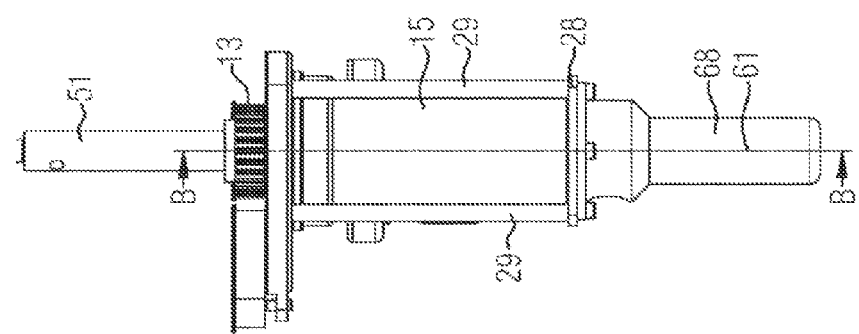
Figure 8:
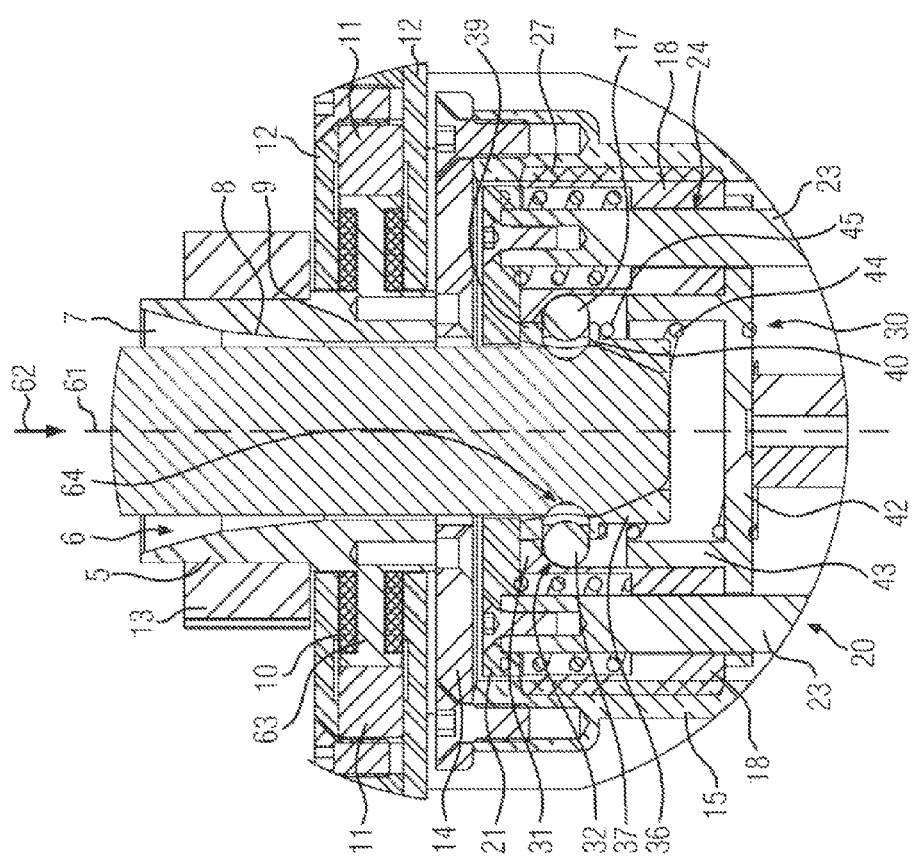
Figure 11A:
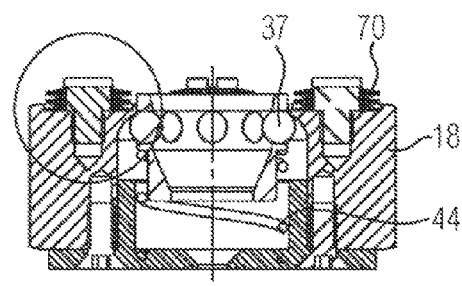
Figure 11C:
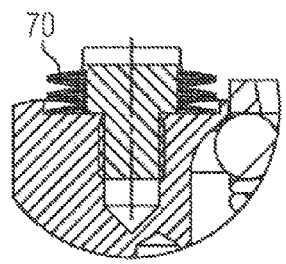
Figure 11D:
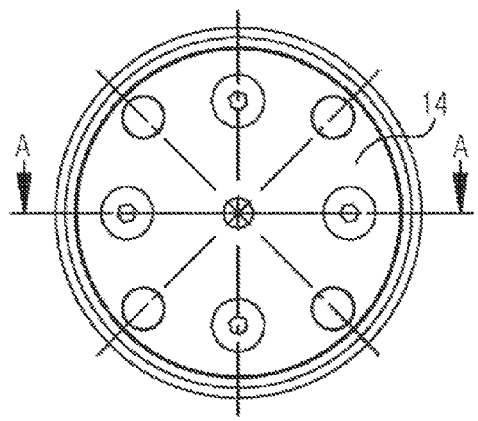
Figure 11B:
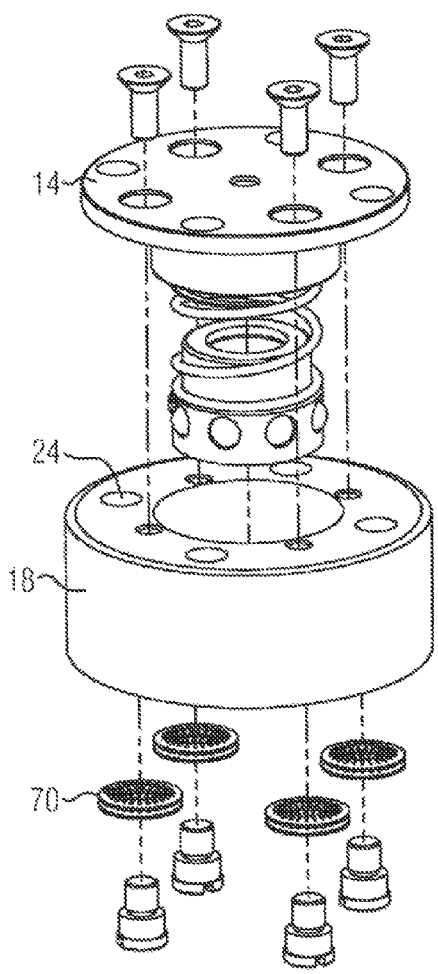

The invention is explained in detail below with the aid of the drawings, which show in:

FIG. 1a a handling device and a test head with a docking device according to the prior art, in the connected state FIG. 1b the handling device and the test head with the docking device of FIG. 1a before connection FIG. 2a a handling device and a test head with a guided approach device according to the invention in the connected state FIG. 2b the handling device and the test head with the guided approach device of FIG. 2a before connection FIG. 3 a roughly simplified schematic view of a guided approach device with catch pin not retracted, in a side sectional view FIG. 4 a roughly simplified schematic view of a guided approach device from FIG. 3 with catch pin retracted, in a side sectional schematic view FIG. 5 a guided approach device according to the present invention in a perspective view FIG. 6 the guided approach device of FIG. 5 in a side view FIG. 7 the guided approach device of FIG. 5 in a sectional view FIG. 8 the area of the guided approach device of FIG. 7 with a front end of a catch pin together with a pin socket, in an enlarged view FIGS. 9a-9d the guided approach device in sectional views in various approach positions FIGS. 10a-10d respectively enlarged view of the area with the front end of the catch pin of the guided approach device according to FIGS. 9a-9d FIGS. 11a-11d a further embodiment of a pin socket in a sectional view, perspective exploded view, enlarged view of an area of the sectional view, and a top view.

Figure 12:
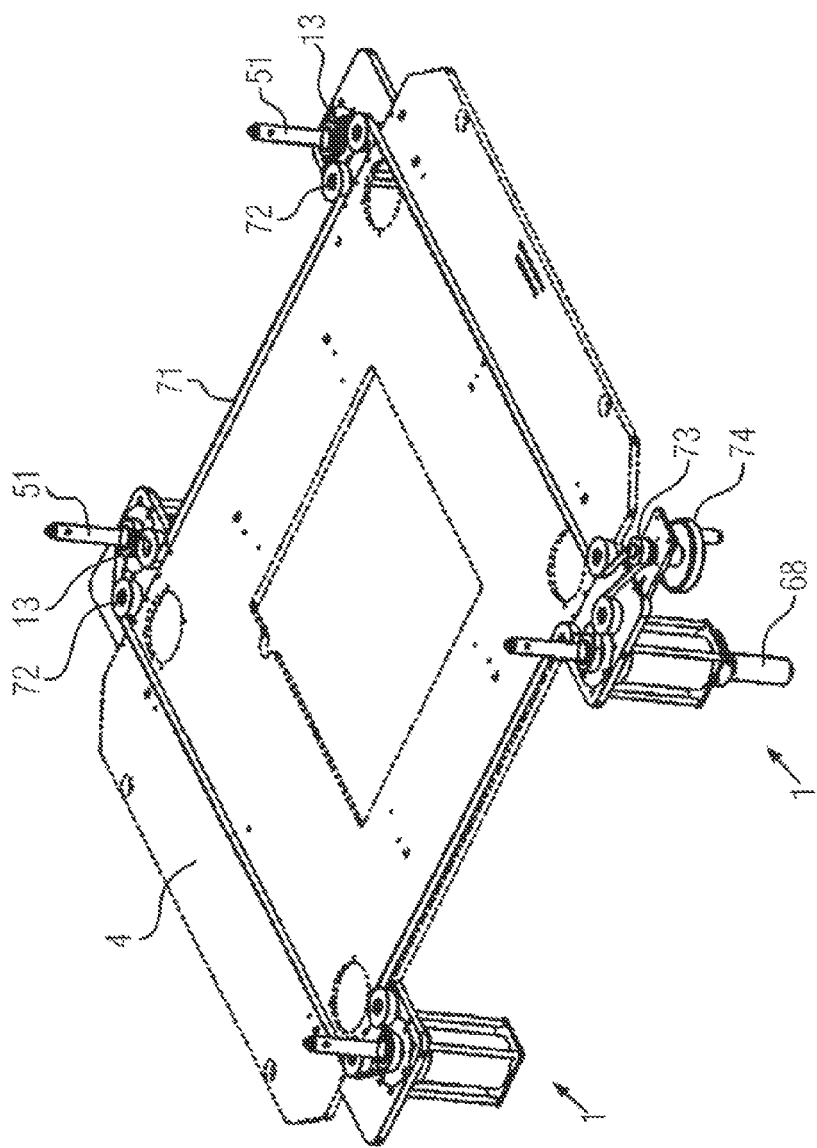

FIG. 12 a mounting plate with four guided approach devices, and

FIGS. 13a, 13b a test head with guided approach devices according to the invention in a perspective view, and a section thereof in an enlarged view.

The guiding together of a test head 2 and a handling device 3 is described in general below.

A handling device 2 may, just like a test head, have a weight of ranging from several 100 kg up to over a tonne. For a semiconductor device to be tested to have reliable electrical contact, a stable and mechanically precise connection must be made between handling device and test head.

In the handling device, semiconductors are fed to a test point. The test point is formed by an interface unit, which is located in the area of the connection interface of the handling device and the test head 2, and has a multiplicity of spring contacts, for contacting the contact points of the semiconductors to be tested. The semiconductors to be tested may be individual semiconductor devices without a casing, or even wafers. They have complex analog or digital circuits with a multiplicity of contact points, which must be contacted to carry out a test. The test head has testing electronics, which are used to carry out the electrical measurements automatically.

Firstly, however, the handling device and the test head must be guided together. In the context of the position, guiding together means that the handling device 3 and the test head 2 are guided together over a predetermined distance, which is preferably at least 10 cm, in particular at least 15 cm or 20 cm. This means that the spring contacts of the interface device, after the guided approach, need not yet be finally positioned, so that a test may be carried out. For the final alignment and fixing of the test head on the handling device, and therefore for the exact positioning of the interface unit at the test point, a docking device may also be provided.

For the guided approach of the test head and the handling device, the test head is mounted on a manipulator, in order for it to be moved.

The basic structure of a guided approach device for the guiding together of a handling device 3 and a test head 2 is generally described below (FIG. 3, FIG. 4).

The guided approach device 1 for guiding together a handling device 3 and a test head 2 includes a cylindrical pin socket 30 for accommodating a catch pin 51.

The cylindrical pin socket 30 has a latching device 17, so that a front end of the catch pin 51 may be held and fixed by latching in the pin socket 30.

The latching device 17 has latching elements 52, which are so arranged on the inner circumference of the pin socket that they are able to encompass a leading end section of a catch pin 51. The latching elements 52 may be pressed radially inwards by a spring element 53 so that, for fixing by latching, they are able to engage in a corresponding recess or groove on the catch pin 51. As latching elements 52, for example, several balls evenly spaced apart from one another, may be provided. However, other known latching mechanisms, such as e.g. pins, bolts, cams or the like, may also be provided.

The cylindrical pin socket 30 is connected to a linear displacement device 54 in such a way that the cylindrical pin socket 30 may be shifted in a straight line by the linear displacement device 54 by at least a distance corresponding to a multiple of the length of the leading section 50 of the catch pin 51 which may be inserted into the pin socket. The leading section 50, insertable in the pin socket (30), of the catch pin 51 extends from the front end of the catch pin 51 to the area in which the latching elements 52 of the latching device 17 engage in the catch pin.

The linear displacement device 54 includes a linear guide 55 and a movement device 56. In the embodiment shown in FIGS. 3 and 4, the linear guide is formed by two parallel bars 57 and two bushings 58 formed on the pin socket 30, through which the bars 57 extend and along which the bushings 58 can slide. One of the two bushings 58 is connected to the movement device 56. In the embodiment shown in FIGS. 3 and 4, the movement device 56 is a belt or chain drive with a continuous belt 59. The belt 59 is guided around two rollers, with one of the two rollers being driven by a motor (not shown).

Formed in the pin socket 30 is a seating area to accommodate the catch pin.

A seating area, in the context of the present invention, is understood to means the recess in the pin socket 30 in which the front end of the catch pin 51 is held and fixed by latching.

Furthermore, the pin space is understood to mean the entire space of the guided approach device 1 taken up by the catch pin in the maximum drawn-in state. In the present embodiment this is a cylindrical space extending in the direction of the longitudinal axis 61 of the guided approach device 1 and with a diameter corresponding to the diameter of the cylindrical recess of the pin socket 30.

The movement device 56 acts offset to the side of the seating area or the pin space formed in the pin socket 30.

This means that the flow of force from the movement device forming the drive is offset parallel to the longitudinal axis 61 on to the pin socket 30 which forms the output.

The guided approach device 1 has at one end area an insertion bushing 60. The insertion bushing 60 is made with a conical inner face forming an insertion funnel for insertion of the catch pin 51. The insertion funnel tapers from the outside to the inside. The insertion bushing 60 is fixed in position and aligned with the cylindrical pin socket.

During insertion of a catch pin 51 into the guided approach device 1, the socket 30 is located adjacent to the insertion bushing 60 (FIG. 3). The insertion bushing 30 has, in the area adjacent to the pin socket, approximately the same inside diameter as the pin socket 30. A catch pin 51, even when it is inserted with an inclination of a few degrees relative to the longitudinal axis 61 of the guided approach device 1, is inserted safely in the pin socket 30 by its front end, by means of the insertion bushing 60. In the socket 30, the insertion pin 51 is fixed by means of the latching device 17.

By means of the movement device 56, the pin socket 30 and with it also the catch pin 51 are drawn into the guided approach device 1 (FIG. 4).

The insertion bushing 60 and the pin socket 30 have a somewhat greater inside diameter than the outside diameter of the catch pin 51. Because of this play, the catch pin 51 may also be fitted with some inclination relative to the longitudinal axis 61, even during engagement (FIG. 3). If then the pin socket 30 and with it the catch pin 51 are drawn in, then the pin socket 30 moves away from the insertion bushing 60. The play in the area of the insertion bushing 60 and the pin socket 30 is the same; however, since the catch pin 51 is now aligned at its two end areas with this play relative to the longitudinal axis 61, the inclination of the catch pin is now slight relative to the longitudinal axis 61. Through the drawing-in over a long distance it is therefore possible not only for a test head and a handling device to be guided together over a long distance, but also an alignment of the catch pin 51 relative to the longitudinal axis 61 is effected, even when there is play relative to the catch pin in the area of the insertion bushing 60 and the pin socket 30. This means that, during engagement (FIG. 3), the alignment of the test head relative to the handling device may be imprecise, with the alignment of the test head and the handling device relative to one another being made more precise by the drawing-in of the catch pin.

The guided approach device 1 serves for the guiding together of a handling device comprised of a handler or a tester, and a test head. These two devices are also described below as first device 2 and second device 3. The guided approach device 1 may be fitted to the first or the second device 2, 3. The corresponding catch pin is then fastened to the respective other device 3, 2, so that the first and the second device may be guided together. The guided approach device may be integrated into the first or the second device. It is however also possible for the guided approach device 1 to be fitted to a mounting plate. The mounting plate may be fixed to an existing first or second device, so that already existing devices may be equipped with the guided approach device. By means of the mounting plate it is therefore possible for an already existing handling device or an existing test head to be retrofitted with the guided approach device.

Preferably several, in particular two, three or four guided approach devices are provided for guiding together a first and a second device. These several guided approach devices are preferably driven synchronously, so that the several catch pins are drawn in synchronously.

A preferred embodiment of the guided approach device 1 is described below with the aid of FIGS. 5 to 8.

This embodiment of a guided approach device 1 is formed on a mounting plate 4. The mounting plate 4 may for example be connected by screw connections to the first device 2 or the second device 3.

Fitted to the mounting plate 4, at a distance from and parallel to it, is a baseplate 28 (FIGS. 5, 6). The baseplate 28 is joined to the mounting plate 4 by four long spacer pins 29. The spacer pins 29 are fastened at the corner zones of the rectangular baseplate 28.

The mounting plate 4 has in the area opposite the baseplate 28 an opening, into which the cylindrical insertion bushing 5 is inserted. A direction pointing from the insertion bushing 5 to the baseplate 28 is described below as the direction of entry (arrow 62 FIG. 8). The insertion bushing 5 is arranged coaxial to a longitudinal axis 61, which stands perpendicular to the plane of the mounting plate 4.

The insertion bushing 5 has an insertion opening 6. The insertion opening 6 includes preferably in the direction of entry 62 a first conical section 7, a second conical section 8 and a cylindrical section 9. The first conical section 7 has an opening angle of around up to 25°. The second conical section 8 has opening angle of around 10° to 15°.

Formed in the area of the cylindrical section 9 on the outside of the insertion bushing 5 is a continuous annular web 63. Provided above and below the annular web in each case is an axial bearing 10, and on the radial outer edge is a radial bearing 11. The bearings 10, 11 are fixed in the mounting plate 4 at top and bottom by an upper and a lower bearing plate 12. The bearing plates 12 are connected to the mounting plate 4 by screw connections. By means of the axial bearing 10 and the radial bearing 11, the insertion bushing 5 is fixed and rotatably mounted in the axial and radial directions.

Formed in the area of the first and second conical sections 7, 8, on the outside of the insertion bushing 5, is a single-piece rotary flange 13. The rotary flange may have teeth, which may engage with a toothed belt.

The rotatably mounted insertion bushing 5 extends for a short distance below the lower bearing plate 12. Fixed to the underside of the insertion bushing 5 in FIGS. 7 and 8 is a threaded tube seating plate 14. The connection of the threaded tube seating plate 14 and the insertion bushing 5 is made for example by means of suitable screw connections.

Fixed to the threaded tube seating plate 14 is a threaded tube 15. The connection of the threaded tube 15 and the threaded tube seating plate 14 may be made for example by means of screw connections. The threaded tube 15 is coaxial with the longitudinal axis 61.

The insertion bushing 5, the threaded tube seating plate 14 and the threaded tube 15 form a unit mounted rotatably around the longitudinal axis 61.

Provided within the threaded tube 15 is a cylindrical pin socket 30 with a latching device 17, which may be displaced along the longitudinal axis 61.

The pin socket 30 includes a threaded sleeve 18, with an outside thread 19 formed on its outer side. The outside thread 19 makes meshing engagement with the inside thread 16 of the threaded tube 15.

For axial guidance and for locking against turning, the pin socket 30 is guided by an axial guidance device 20. The axial guidance device 20 includes preferably four guide pins 23, which are fastened to the baseplate 28 and run parallel to the longitudinal axis 61. Arranged adjacent to but with slight clearance from the threaded tube seating plate 14 is a cover plate 21, which is connected to the guide pins 23 for example via screw connections. The cover plate 21 is, in contrast to the threaded tube seating plate 14, non-rotatably fitted.

The guide pins 23 are arranged inside the threaded tube 15, and the spacer pins 29 outside the threaded tube 15.

Formed in the threaded sleeve 18 of the pin socket 30 are four guide bores 24 extending in the axial direction, through each of which extends a guide pin 23. This makes possible guided displacement of the pin socket 30 in the axial direction, and it is also ensured that the pin socket 30 does not turn during displacement. On the side facing the cover plate 21, the guide bores 24 of the threaded sleeve 18 are expanded in a step-like manner, to accommodate in each case one spring element 27. This section is described below as the spring seating section 25. The spring elements 27 are for example coil springs. The function of these spring elements 27 will be explained in detail below.

Formed in the centre of the threaded sleeve 18 is a through hole extending in the axial direction. Formed at the edge of this through hole facing the cover plate 21 is an annular web 31, protruding inwards, which has on that side of it facing towards the baseplate 28 a mandrel-like clamping section 32.

In addition, the pin socket 30 has a ball cage 36 mounted inside the threaded sleeve 18. The ball cage 36 is held in the threaded sleeve 18 with scope for displacement in the axial direction, and serves for guidance and holding of balls 37.

On the side facing towards the baseplate 28, the pin socket is closed by a stop plate 42. The stop plate 42 is connected to the threaded sleeve 18 for example by means of screw connections. The stop plate 42 also has a ring section 43 extending into the through hole of the threaded sleeve 18. Located inside the ring section 43 of the stop plate 42 is a spring element 44. The spring element 44 is for example in the form of a coil spring. The ball cage 36 has a draw-in annular step 45, on which rests one end of the spring element 44. The spring element 44 extends through an intermediate space between the ball cage 36 and the ring section 43, resting with its other end on the stop plate 42. By means of the spring element 44, the ball cage 36 is biased by a spring force against the direction of entry 62.

The ball cage 36 has on the side facing towards the cover plate 21 a cylindrical side wall 39, in which e.g. altogether eight ball entry holes 40, extending in the radial direction, are formed. Mounted in each ball entry hole 40 is a ball 37. The ball entry holes 40 extend through the side wall 39 and are spaced equally apart from one another in the circumferential direction.

The diameter of the ball entry holes 40 at the radial outer end is somewhat greater than that of the balls 37, so that the balls 37 are able to move from the radial outside into the ball entry holes 40. At the radial inner end, on the other hand, the diameter of the ball entry holes 40 is tapered, i.e. smaller than that of the balls 37. This avoids the possibility that the balls 37 might pass through completely into the hollow space of the ball cage 36. The inner face of the ball cage 36 tapers conically in the area facing the baseplate, so that a catch pin 51 with its corresponding complementary conically-shaped front end section may be held positively.

The height of the ball cage 36 is significantly less than the distance between the annular web 31 of the threaded sleeve 18 and the stop plate 42, so that the ball cage 36 is mounted movably in the axial direction inside the pin socket 30.

The catch pin 51 is an elongated cylindrical body, at the front end section of which is moulded a conical section which serves as entry bevel. The catch pin 51 has adjacent to the entry bevel a continuous annular groove 64, in which the balls 37 may engage by latching.

The mode of operation of the guided approach device according to the invention will be explained below with the aid of FIGS. 9a to 9d and 10a to 10d.

FIGS. 9a and 10a show the initial position of the guided approach device 1, in which the pin socket 30 is positioned adjacent to the cover plate 21. The threaded sleeve 18 is held at a distance from the cover plate 21 by the spring element 27. The ball cage 36 is pressed by the action of the spring element 44 against the cover plate 21 and protrudes slightly at the annular web 31 of the threaded sleeve 18. By this means, the balls 37 are pressed against the clamping section 32 and so radially inwards. The balls 37, pressed in this way radially inwards, engage on insertion of a catch pin 51 in its annular groove 64, so that this is fixed by latching in the pin socket 30.

By rotating the insertion bushing 5 and with it the threaded tube 15 in a first predetermined direction, the pin socket 30 is moved by the meshing engagement between the threaded tube 15 and the threaded sleeve 18 in the direction of the baseplate 28. Since the catch pin is fixed by latching in the pin socket 30, it accompanies the movement. The pin socket 30 reaches its end position when it strikes against the baseplate 28 with its stop plate 42 (FIGS. 9b, 10b). In this position, the front end of the catch pin 51 is positioned with clearance from the stop plate 42.

The catch pin 51 may be moved a little further towards the stop plate 42 from the outside, i.e. not by the movement device formed by the meshing engagement between the threaded tube 15 and the threaded sleeve 18, but by another device, such as e.g. an additional docking device. The catch pin 51 is therefore held with movement play in the direction of entry 62.

FIGS. 9c, 10c show the state in which the catch pin 51 is retracted into the guided approach device 1 to the maximum extent, striking with its front end against the stop plate 42.

When the catch pin 51 moves out of the guided approach device, the threaded tube 15 is rotated in the opposite direction to the inward movement. By this means, the pin socket 30 is moved towards the cover plate 21. In the position shown in FIGS. 9a and 10a, the ball cage 36 strikes against the cover plate 21. Here the spring element 27 also abuts the cover plate 21 in such a way that the spring element 27 counteracts, with some pre-tension, the further movement of the threaded sleeve. This spring force must be overcome in order to move the threaded sleeve 18 with the clamping section 32 further towards the cover plate 21. Since the ball cage already abuts the cover plate, the threaded sleeve 18 and with it the clamping section 32 are moved relative to the ball cage 36, by which means the balls 37 are released. The balls 37 move a short distance radially outwards from the ball entry holes 40, which releases the engagement with the catch pin 51. Due to the spring element 27, it is therefore necessary to apply additional force to release the latching engagement between the catch pin 51 and the guided approach device.

The spring element thus forms a securing device, which makes it possible for the catch pin to be moved out of the guided approach device but not released, before the spring force of the spring element 27 is overcome.

In operation it may be sufficient for maintenance work for the catch pin to be moved out of the guided approach device but not released. Through the additional force application needed to release the connection, an extended but not yet disengaged position may be approached.

In addition or alternatively to the spring element 27, a further securing device may be provided, which safely and reliably prevents unintended disengagement of the catch pin from the latching device.

The securing device may be so designed that an axially extending locking pin 65 is provided on the side of the stop plate 42 facing the baseplate 28. The locking pin 65 extends through a central opening in the baseplate 28. The locking pin 65 has an annular groove 66 at that end furthest away from the pin socket 30. The annular groove 66 is stepped at its edge furthest away from the pin socket 30, while its edge facing towards the pin socket 30 is designed as a slide bevel 67.

Located on the side of the baseplate 28 facing away from the pin socket 30 is a tubular housing 68, into which the housing 68 enters when a catch pin 51 is drawn in. Adjacent to the baseplate 28 on the housing 68, a spring pin 69 is arranged transversely to the longitudinal axis 61 and is so spring-loaded that its end face presses against the peripheral surface of the locking pin 65.

In the position of the pin socket according to FIGS. 9a and 10a, the spring pin 69 engages in the annular groove 66 of the locking pin 65. The stepped edge of the annular groove 66 prevents the locking pin 65 from being moved further against the direction of entry 62, and the latched connection between the pin socket 30 and a catch pin 51 is released. The spring pin must be drawn a short distance out of the housing 68, so that the engagement with the annular groove 66 is released. Then the locking pin 65 and the pin socket may be moved a little further against the direction of entry, and the latching engagement is released. Thus, the upwards axial movement of the latching device is so restricted that the latching elements, e.g. the balls 37, of the latching device remain fixed in their latching position. Only through a release of the locking of the locking pin 65 can the latching elements be disengaged from the catch pin.

The securing device (FIGS. 11a-11d) may also be so designed that disc springs 70 are provided instead of the spring element 27, and are mounted on the end face of the threaded sleeve 18 facing the cover plate. The disc springs are fastened by screws to the threaded sleeve 18. The threaded tube seating plate 14 has recesses into which the heads of the screws may enter; however the disc springs do not fit into the recesses. Like the spring elements 27, the disc springs must be pressed together in order to allow a relative movement between the threaded sleeve 18 and the ball cage 36. The disc springs 70 provide, with limited overall height, a high spring force which must be overcome in order to release the latching connection.

In the embodiments explained above, the catch pin 51 is held in the drawn-in position with play in the axial direction. Only if there is additional external action on the catch pin 51, does it strike with its front end against the stop plate 42 (FIGS. 9c, 10c). In these embodiments it is provided that they work together with an additional docking device, with which the final position of the handling device and the test head is determined and fixed. Consequently, the guided approach device may be designed with considerable play in the axial direction and/or transversely to the axial direction, in comparison with a docking device. The guided approach device is preferably combined with a docking device according to that of DE 102 16 003 B4. Reference is hereby made to the contents of DE 102 16 003 B4 in full.

Within the scope of the invention it is however also possible in principle for the drawn-in position of the catch pin to be substantially without play. For this purpose it is possible to provide on the catch pin a conical stop, designed to match the first or second conical section of the insertion opening 6. Such a stop would not only limit the movement of the catch pin in the direction of entry 62, but would also centre the catch pin. Alternatively, the stop may also act together with the end face of the insertion opening 6, or stop pins may be provided on the baseplate 28, facing towards the cover plate 21 and able to reach through corresponding openings in the stop plate 42, and against which the catch pin strikes with its end face in the drawn-in position according to FIGS. 9b, 10b. Such a guided approach device may in addition take over the function of conventional docking devices.

FIG. 12 shows in schematic form a mounting plate 4 with four guided approach devices 1 according to the invention, each located in a corner area of the roughly rectangular mounting plate 4 shown in the top view. To illustrate the invention, a catch pin 51 is inserted in each of the guided approach devices 1. Provided for actuation of the guided approach devices 1 is a toothed belt 71, which is in the form of a continuous toothed belt circulating at the edge area of the mounting plate 4. The toothed belt is guided by guide rollers 72. The toothed belt 71 is in engagement with a drive gear 73. The drive gear 73 is connected to a hand wheel 74 which may be used to turn the drive gear 73 manually so that the toothed belt 71 can be set in motion. The toothed belt 71 is in meshing engagement with the rotary flanges 13 of the guided approach devices 1. Since all guided approach devices 1 are coupled to the same toothed belt 71, they are actuated synchronously. This has the effect that the catch pin 51 is moved in or out synchronously.

Only one guided approach device 1 is provided with a securing device with a locking pin 65 (the relevant housing 68 may be discerned in FIG. 12). A single securing device is sufficient to secure the release of the latching connection, since all guided approach devices 1 are actuated synchronously.

Instead of a toothed belt 71, it is also possible to provide a continuous chain.

Instead of a hand wheel, a motor may also be provided (electrical stepping motor, hydraulic motor, etc.), so that the guided approach devices may be operated automatically by a control unit.

The mounting plate 4 is designed for the attachment of a test head 2 (FIG. 13a). Shown in schematic form and very simplified in FIG. 13a is an interface module 75, which has spring contact pins (not shown) for contacting the contact points of the respective test pieces.

Preferably a drawer module, as disclosed for example in JP0959730A, US2003/0194821A1 or EP1495339B1 or DE102012103893, may be used to insert the interface unit 75 into the test head 2, or the drawer module may be used to move it out, for easy replacement.

The embodiments shown in FIG. 13a show a composite board 76 which has four eyes 77 to each of which a catch pin 51 may be fastened, using a quick-action mechanism for connection or release. The composite board 76 is designed for attachment to a handling device 3. Both the mounting plate 4 and also the composite board 76 are roughly rectangular viewed from above, and have a central large-area opening. They thus form a rectangular frame.

Fixed to the mounting plate 4 are bushings 78 of a conventional docking device with corresponding latching pins 79 on the composite board 76.

The guiding together of the test head 2 and the handling device is carried out using the guided approach devices 1. The moving apart of the test head and the handling device is also performed by the guided approach device 1. In this embodiment, on the other hand, exact positioning and fixing is undertaken by the docking device 78, 79.

The system according to the invention for the guiding together of a first device consisting of a handler or a tester with a second device comprising a test head for electronic components includes preferably a handling device, a test head fixed to a movable manipulator, and at least one guided approach device according to the invention, together with a corresponding catch pin. The whole operation of guiding together and release of test head and handling device may be carried out by a single person. The manipulator takes the weight of the test head and, due to the fact that at least one catch pin is provided, the test head need only be roughly positioned, after which it is tightened by the latching device of the guided approach device and "exactly positioned".

In the embodiments explained above, the linear displacement device is in the form of a threaded sleeve with inside thread, which engages in a corresponding outside thread of the threaded sleeve. The linear displacement device 50 may however also be a belt or chain drive a worm drive, for example a threaded rod which is set into a rotary motion by a drive and in this way effects a displacement of the latching device, or also an hydraulic or a pneumatic drive.

LIST OF REFERENCE NUMBERS 1 guided approach device
2 first device (test head)
3 second device (handling device)
4 mounting plate
5 insertion bushing
6 insertion opening
7 first conical section
8 second conical section
9 cylindrical section
10 axial bearing
11 radial bearing
12 bearing plate
13 rotary flange
14 threaded tube seating plate
15 threaded tube
16 inside thread
17 latching device
18 threaded sleeve
19 outside thread
20 axial guidance device
21 cover plate
22 -
23 guide pin
24 guide bore
25 spring seating section
26 -
27 spring element
28 baseplate
29 spacer pin
30 pin socket
31 annular web
32 clamping section
33 -
34 -
35 -
36 ball cage
37 ball
38 bottom plate
39 side wall
40 ball entry hole
41 -
42 stop plate
43 ring section
44 spring element
45 annular step
46 -
47 -
48 -
49 -
50 -
51 catch pin
52 latching element
53 spring element
54 linear displacement device
55 linear guide
56 movement device
57 rod
58 bushing
59 belt/chain
60 insertion bushing
61 longitudinal axis
62 arrow (direction of entry)
63 annular web
64 annular groove
65 locking pin
66 annular groove
67 slide bevel
68 housing
69 spring pin
70 disc spring
71 toothed belt
72 guide roller
73 drive gear
74 hand wheel
75 interface module
76 composite board
77 eye
78 bushing
79 latch pin

The invention claimed is:

1. A guided approach device for a first device consisting of a handler or a tester and a second device that includes a test head for electronic components, wherein the guided approach device is attached to one of the first device or the second device, said guided approach device comprising:
a latching device with a cylindrical pin socket for holding and fixing by latching a front end of a catch pin correspondingly fastened to an other of the first device or the second device to which the guided approach device is attached;
wherein the latching device is connected to a linear displacement device,
wherein the linear displacement device is configured to move the first device and second device at least a distance toward each other by displacing the cylindrical pin socket in a first linear direction,
wherein the linear displacement device is configured to move the first device and the second device at least the distance away from each other by displacing the cylindrical pin socket in a second linear direction that is opposite to the first linear direction, and
wherein the distance corresponds to a multiple of a length of a leading section of the catch pin that is insertable into the cylindrical pin socket.

2. The guided approach device according to claim 1, wherein:
the latching device includes at least one latching element, a spring element to apply a spring force to the latching element and the pin socket, and the catch pin is fixed in the pin socket by the latching element; and
the latching device is connected to the linear displacement device such that the latching element, the spring element and the pin socket of the latching device are displaceable, with the catch pin engaged, in either the first linear direction or the second linear direction by the linear displacement device, such that the first device and the second device are moved toward or away from each other, respectively.

3. The guided approach device according to claim 2, wherein the linear displacement device includes a movement device which acts, offset to the side of a seating area formed in the pin socket, to hold the catch pin.

4. The guided approach device according to claim 3, further comprising an insertion bushing that is fixed in and aligned with the cylindrical pin socket, which has at least one conical or funnel-shaped insertion section.

5. The guided approach device according to claim 4, wherein the guided approach device is formed on a mounting plate and further comprises an insertion bushing that is rotatably mounted to the mounting plate, wherein the pin socket has a threaded sleeve which is in meshing engagement with a threaded tube, and wherein the threaded sleeve is guided non-rotatably such that by turning the threaded tube the pin socket executes a linear movement.

6. The guided approach device according to claim 5, wherein the pin socket and/or an insertion opening in the insertion bushing have an inside diameter that is sufficiently greater than an outer diameter of the catch pin to permit the catch pin to be inserted at a slight angle of inclination relative to a longitudinal axis of the guided approach device.

7. The guided approach device according to claim 6, further comprising a securing device in the form of a spring element, which prevents unintended release of a latching connection between the catch pin and the pin socket in such a way that the catch pin is moved out of the guided approach device but is not released.

8. The guided approach device according to claim 7, wherein the latching device is automatically released in an end position by movement against a direction of entry, and wherein to reach the end position a spring element which forms the securing device must be overcome, in order to prevent unintended release of the latching connection.

9. The guided approach device according to claim 8, wherein the securing device has a locking pin which is connected to the pin socket such that, in moving the pin socket into a position for release of the latching connection, the locking pin interacts with a securing element in such a way that the further movement of the pin socket is blocked, and this blocking may be unblocked by releasing engagement of the securing element with the locking pin.

10. The guided approach device according to claim 9, wherein the first device and second device are displaceable over a distance of at least 10 cm.

11. The guided approach device according to claim 10, wherein a conical stop is provided on the catch pin that matches a conical section of the insertion opening such that the conical stop and the conical section of the insertion opening abut one another in a drawn-in state of the catch pin and exactly position the catch pin at least in a direction of entry.

12. The system for guiding together a first device consisting of a handler or a tester and a second device comprising a test head for electronic components, said system comprising a guided approach device according to claim 11, wherein said guided approach device is mounted on one of the first device or the second device, and the catch pin is mounted on an other of the first device or the second device, such that the first device and the second device are latched together by the guided approach device and are movable together over a predetermined distance.

13. The system according to claim 12, wherein several guided approach devices and several catch pins are provided, and wherein the guided approach devices are operable synchronously.

14. The system according to claim 13, wherein a drawer module is provided, which includes a mechanism for guided movement in and out of an interface unit from an area between the first device and the second device.

15. The system according to claim 12, wherein the mounting plate is fixed to a docking device.

16. The guided approach device according to claim 1, wherein the linear displacement device includes a movement device which acts, offset to a side of a seating area formed in the pin socket, to hold the catch pin.

17. The guided approach device according to claim 1, further comprising an insertion bushing that is fixed in and aligned with the cylindrical pin socket, which has at least one conical or funnel-shaped insertion section.

18. The guided approach device according to claim 1, wherein the guided approach device is formed on a mounting plate and further comprises an insertion bushing that is rotatably mounted to the mounting plate, wherein the pin socket has a threaded sleeve which is in meshing engagement with a threaded tube, and wherein the threaded sleeve is guided non-rotatably such that by turning the threaded tube the pin socket executes a linear movement.

19. The guided approach device according to claim 1, wherein the pin socket and an insertion opening of an insertion bushing that is fixed in and aligned with the cylindrical pin socket have an inside diameter that is sufficiently greater than an outer diameter of the catch pin to permit the catch pin to be inserted at a slight angle of inclination relative to a longitudinal axis of the guided approach device.

20. The guided approach device according to claim 1, further comprising a securing device in the form of a spring element, which prevents unintended release of a latching connection between the catch pin and the pin socket in such a way that the catch pin is moved out of the guided approach device but is not released.

21. The guided approach device according to claim 20, wherein the latching device is automatically released in an end position by movement against a direction of entry, and wherein to reach the end position a spring element which forms the securing device must be overcome, in order to prevent unintended release of the latching connection.

22. The guided approach device according to claim 20, wherein the securing device has a locking pin which is connected to the pin socket such that, in moving the pin socket into a position for release of the latching connection, the locking pin interacts with a securing element in such a way that the further movement of the pin socket is blocked, and this blocking may be unblocked by releasing engagement of the securing element with the locking pin.

23. The guided approach device according to claim 1, wherein the first device and second device are displaceable over a distance of at least 10 cm.

24. The guided approach device according to claim 1, wherein a conical stop is provided on the catch pin that matches a conical section of an insertion opening of an insertion bushing that is fixed in and aligned with the cylindrical pin socket such that the conical stop and the conical section of the insertion opening abut one another in a drawn-in state of the catch pin and exactly position the catch pin at least in a direction of entry.

25. A system for guiding together a first device consisting of a handler or a tester and a second device comprising a test head for electronic components, said system comprising a guided approach device according to claim 1, wherein said guided approach device is mounted on one of the first device or the second device, and the catch pin is mounted on an other of the first device or the second device, such that the first device and the second device are latched together by the guided approach device and are movable together over a predetermined distance.

26. The system according to claim 25, wherein several guided approach devices and several catch pins are provided, and wherein the guided approach devices are operable synchronously.

27. The system according to claim 25, wherein a drawer module is provided, which includes a mechanism for guided movement in and out of an interface unit from an area between the first device and the second device.

28. The system according to claim 25, wherein the guided approach device is formed on a mounting plate, and wherein the mounting plate is fixed to a docking device.

\* \* \* \* \*